United States Patent [19]
Vlahos et al.

[11] Patent Number: 5,926,751
[45] Date of Patent: Jul. 20, 1999

[54] METHOD AND APPARATUS FOR RECEIVING COMMUNICATION SIGNALS

[75] Inventors: Constantine Vlahos, Mundelein; David Sutherland Peckham, Barrington Hills; Frank Robert Skutta, Palatine, all of Ill.

[73] Assignee: Motorola, Inc., Schaumburg, Ill.

[21] Appl. No.: 08/803,186

[22] Filed: Feb. 19, 1997

[51] Int. Cl.[6] ............................................. H04B 1/18
[52] U.S. Cl. .................. 455/280; 455/150.1; 455/180.1; 455/188.1
[58] Field of Search ................. 455/280, 150.1, 455/179.1, 180.1, 188.1, 189.1, 190.1, 191.3, 269, 255, 256, 257, 258, 272, 276.1, 101, 84, 86, 426, 552, 553

[56] References Cited

U.S. PATENT DOCUMENTS

| | | | |
|---|---|---|---|
| 5,212,824 | 5/1993 | Mishima et al. | 455/188.1 |
| 5,369,800 | 11/1994 | Takagi et al. | 455/276.1 |
| 5,457,734 | 10/1995 | Eryaman et al. | 455/101 |
| 5,722,053 | 2/1998 | Kornfeld et al. | 455/86 |
| 5,732,330 | 3/1998 | Anderson et al. | 455/86 |
| 5,748,049 | 5/1998 | Bayruns et al. | 455/255 |

*Primary Examiner*—Dwayne D. Bost
*Assistant Examiner*—Quochien B. Vuong
*Attorney, Agent, or Firm*—John J. King

[57] ABSTRACT

A method and apparatus enables a communication device (100) to operate in multiple bands, such as GSM 900 MHz, DCS 1800 MHz, and DCS 1900 MHz bands, by eliminating the need for a mixer for each band. In a dual band GSM/DCS 1800 radiotelephone, for example, the local oscillator (LO) injection frequencies for both GSM and DCS bands are provided to a mixer (234) through the use of combination filters (222, 246). Thus, the duplexing and matching requirements to the mixer input are simplified and the signal losses are minimized. The common output ports of the GSM RX/LO combination filter and DCS RX/LO combination filter are duplexed to the input of the mixer. Also, the input impedance matching of the mixer is designed to match the impedance for the received signals in each band, as well as provide an RF trap at the IF frequency. The match at the output of the mixer is designed to match the impedance of the IF filter and provides a low impedance to RF input frequencies. Finally, a tri-band radiotelephone is also described.

9 Claims, 5 Drawing Sheets

METHOD AND APPARATUS FOR RECEIVING COMMUNICATION SIGNALS

FIELD OF INVENTION

The present invention is generally related to communication devices, and more particularly, to a method and apparatus for receiving communication signals.

BACKGROUND OF THE INVENTION

With the increased use of wireless communication devices, spectrum has become scarce. In many cases, network operators providing services on one particular band have had to provide service on a separate band to accommodate its customers. For example, network operators providing service on a GSM system in a 900 MHz frequency band have had to rely on a DCS system at an 1800 MHz frequency band. Accordingly, communication devices, such as cellular radio telephones, must be able to communicate at both frequencies, or even a third system, such as PCS 1900. Such a requirement to operate at two or more frequencies creates a number of problems. For example, the communication device would have increased size and cost if the receiver included separate components to receive signals in each bands.

Accordingly, there is a need for a method and apparatus for receiving communication signals in a plurality of bands while minimizing the increase in components.

DETAILED DESCRIPTION OF THE INVENTION

A method and apparatus enables a communication device to operate in multiple bands, such as GSM 900 MHz, DCS 1800 MHz, and PCS 1900 MHz bands by eliminating the need for a mixer for each band. In a dual band GSM/DCS 1800 radiotelephone, for example, the local oscillator (LO) injection frequencies for both GSM and DCS bands are provided to a mixer through the use of combination filters. Thus, the duplexing and matching requirements to the mixer input are simplified and the signal losses are minimized. The combination RX/LO filters, one for each GSM and DCS bands, are designed with RX and LO input ports and a common RX/LO output port. The common output ports of the GSM RX/LO combination filter and DCS RX/LO combination filter are duplexed to the input of the mixer. Because the duplexing requirements between the RX and LO injection frequencies are accommodated by the combination filters, the circuit design reduces the number of duplex lines to the mixer from six to two for a dual band communication device and from ten to four for a tri-band communication device. Also, the input impedance matching of the mixer is designed to match the impedance for the received signals in each band, as well as provide an RF trap at the IF frequency. Finally, the output circuit of the mixer provides a low impedance to the RF input frequency and also a match to the input of the IF filter.

Figure 1:
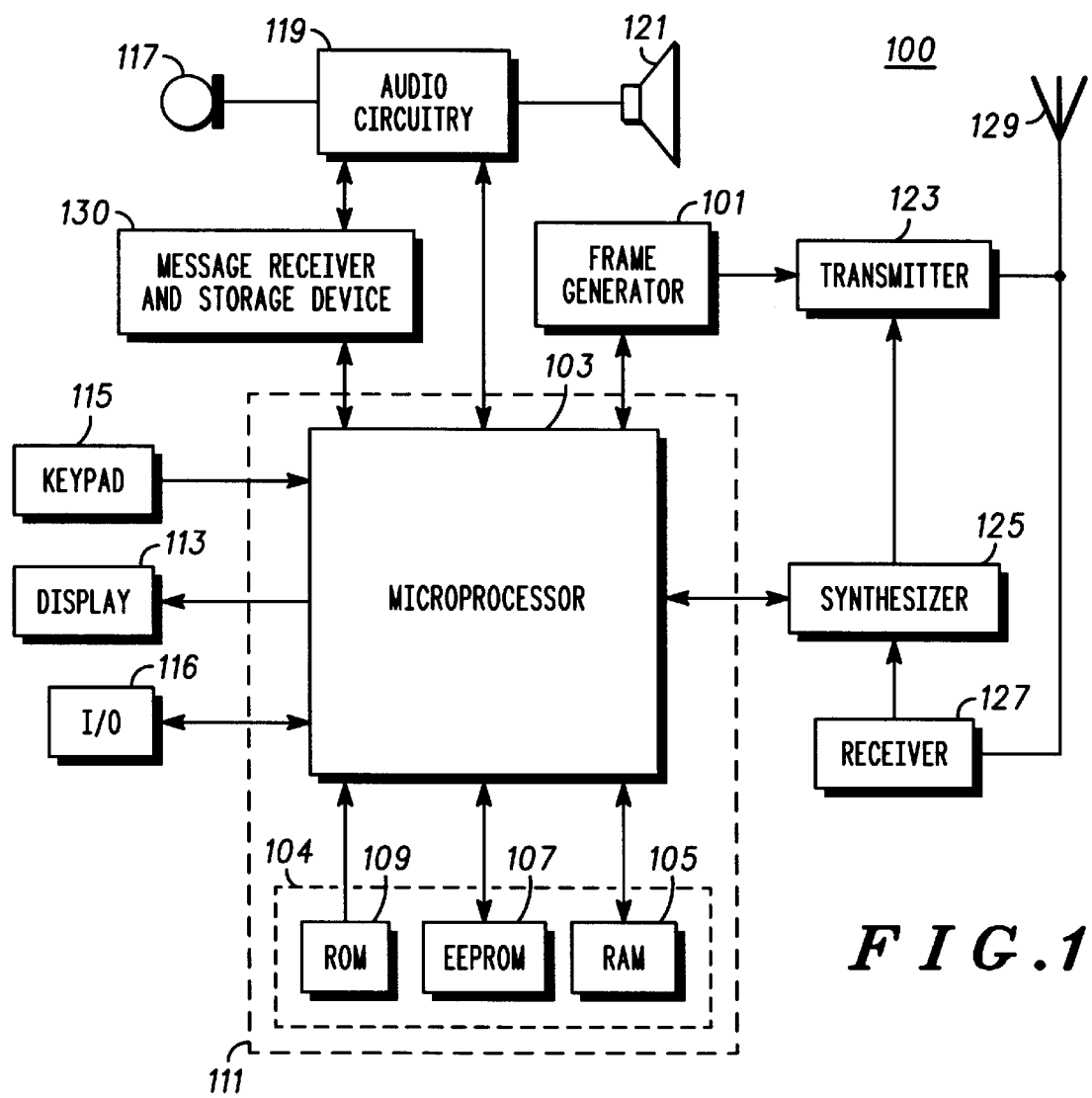
FIG. 1 is block diagram of a communication device according to the present invention.

Turning now to FIG. 1, a block diagram of a wireless communication device such as a cellular radiotelephone incorporating the present invention is shown. In the preferred embodiment, a frame generator ASIC 101, such as a CMOS ASIC available from Motorola, Inc. and a microprocessor 103, such as a 68HC11 microprocessor also available from Motorola, Inc., combine to generate the necessary communication protocol for operating in a cellular system. Microprocessor 103 uses memory 104 comprising RAM 105, EEPROM 107, and ROM 109, preferably consolidated in one package 111, to execute the steps necessary to generate the protocol and to perform other functions for the wireless communication device, such as writing to a display 113, accepting information from a keypad 115, accepting input/output information by way of a connector 116 according to the present invention, controlling a frequency synthesizer 125, or performing steps necessary to amplify a signal according to the method of the present invention. ASIC 101 processes audio transformed by audio circuitry 119 from a microphone 117 and to a speaker 121.

A transceiver processes the radio frequency signals. In particular, a transmitter 123 transmits through an antenna 129 using carrier frequencies produced by a frequency synthesizer 125. Information received by the communication device's antenna 129 enters receiver 127 which demodulates the symbols using the carrier frequencies from frequency synthesizer 125. The communication device may optionally include a message receiver and storage device 130 including digital signal processing means. The message receiver and storage device could be, for example, a digital answering machine or a paging receiver.

Figure 2:
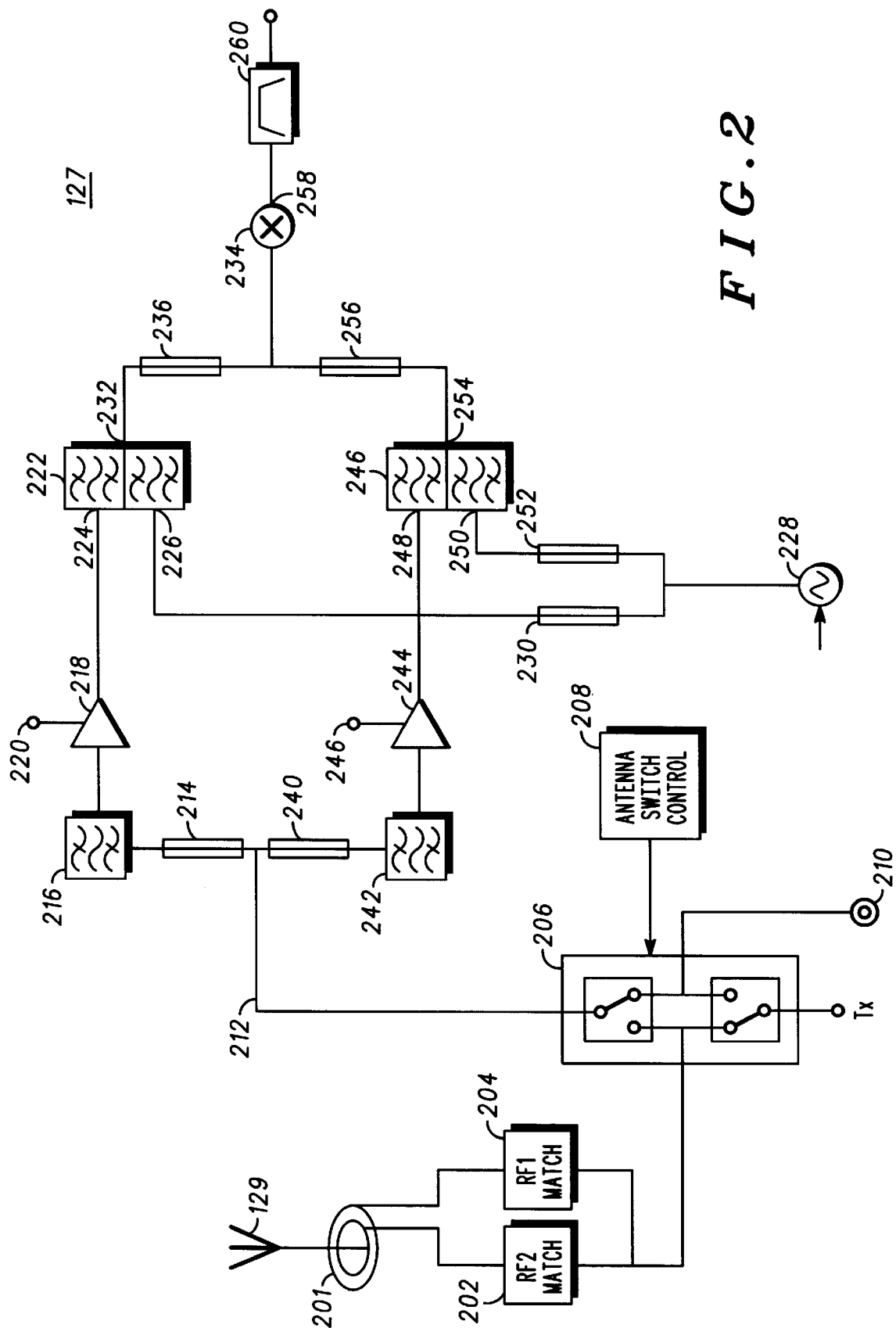
FIG. 2 is a block diagram of receiver 127 of FIG. 1 according to the present invention.

Turning now to FIG. 2, a block diagram shows a receiver 127 for a dual-band radiotelephone according to the present invention. An RF signal received by antenna 129 is coupled to a matching circuit 201 comprising a first RF matching block 202 and a second RF matching block 204. The RF matching circuits are designed to provide the proper impedance match to the receiver, depending upon the frequency of the received signal. The RF signal is then coupled to an antenna switch 206 which is controlled by an antenna switch control circuit 208. The antenna switch control enables the RF signals to be received and transmitted by an accessory coupled to the communication device by connector 210. For example, a hands-free accessory for enabling hands-free operation in a vehicle could be coupled to connector 210 according to the present invention.

The received RF signal is then provided to a plurality of paths of the receiver by a line 212. That is, a separate path will be provided for each band, depending upon the number of bands available to the communication device. In particular, line 212 is coupled to a transmission line 214 which provides the RF signal to a first filter 216. For example, filter 216 could be a three pole bandpass ceramic filter used as a preselector filter. For example, the ceramic filter could be tuned to pass RF signals at 935 to 960 MHz in the GSM receive band. The filter signal is then transmitted to a preamplifier 218. Preferably, preamplifier 218 includes an enable line 220 for enabling or disabling the preamplifier. Preferably, the enable line controls a transistor to provide isolation to the mixer from transmitter energy and other spurious frequencies. The output of the preamplifier 218 is coupled to a combination filter 222 at a first input 224 and a LO injection frequency at a second input 226 by way of a transmission line 230 coupled to a voltage controlled oscillator 228. In the first path, for example, a combined ceramic monoblock filter could receive 935–965 MHz in the GSM band and LO injection 720–745 MHz. A common output port 232 of filter 222 is coupled to a mixer 234 by way of transmission line 236.

Line 212 is also coupled to a second RF path by way of a transmission line 240 which is coupled to a second filter 242. The second filter could also be a three pole bandpass ceramic filter, for example, used a preselector filter. The output of filter 242 is coupled to a second preamplifier 244. Preferably, preamplifier 244 also has an enable line 246 to provide isolation to the mixer from transmitter energy and other spurious frequencies. The output of preamplifier 244 is coupled to a second combination filter 246 at a third input 248. The combined filter 246 is also coupled to receive the LO frequency at a fourth input 250 by way of transmission line 252. A combined output 254 is also coupled to mixer 234 by way of a transmission line 256. As will be described in more detail to FIG. 3, mixer 234 generates an intermediate frequency (IF) signal at an output 258. The IF signal which is preferably 215 MHz is provided to a filter 260, such as a SAW bandpass filter.

Figure 3:
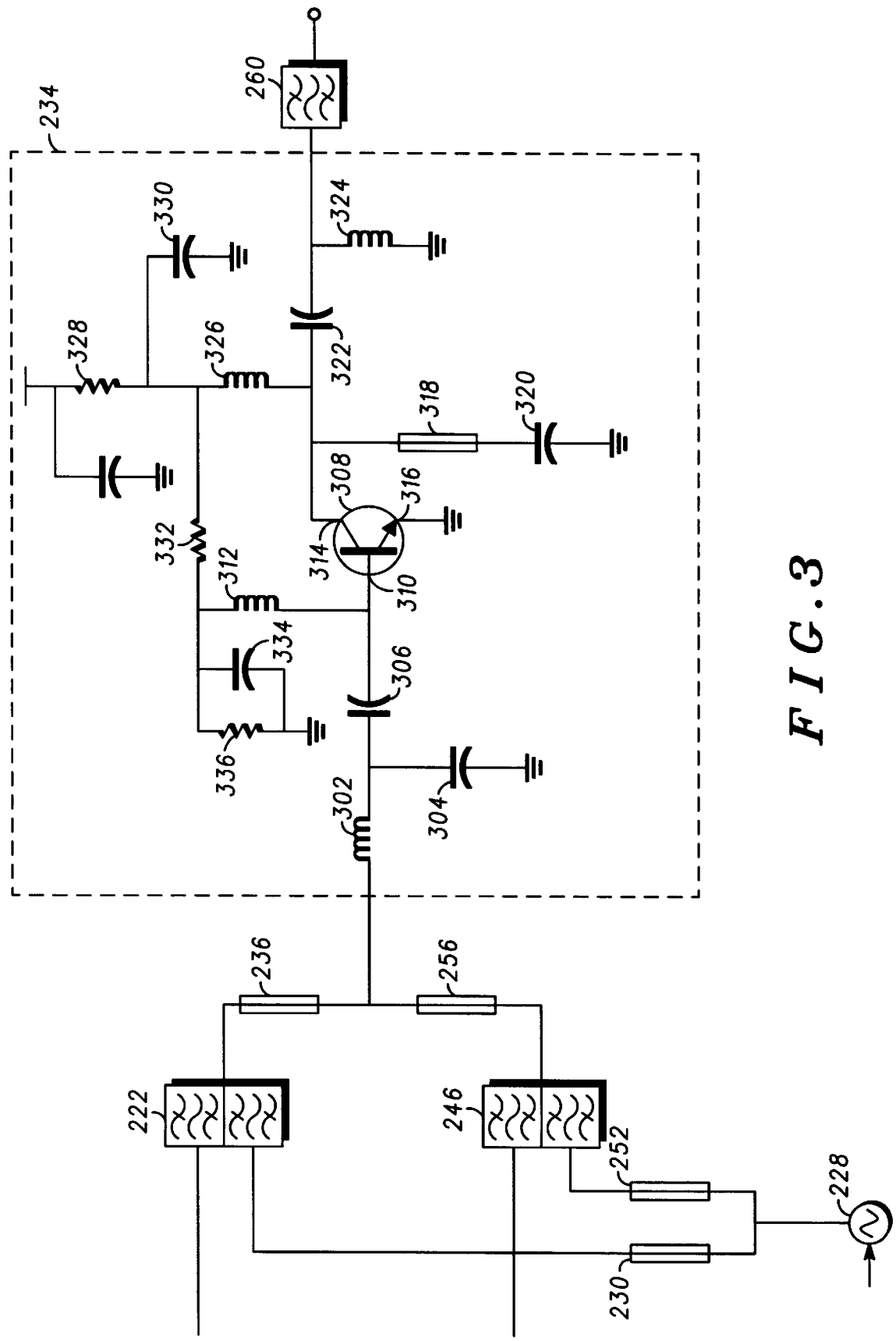
FIG. 3 is schematic diagram of mixer 234 according to the present invention.

Turning now to FIG. 3, a circuit diagram shows mixer 234 of FIG. 2. The mixer is designed to operate in a dual band radiotelephone, such as a phone adapted to operate at both DCS 1800 MHz and GSM 900 MHz frequencies bands. The mixer input circuit is designed to match 50 ohm in all bands and to filter the output 215 MHz IF signal. Similarly, the mixer output circuit is designed with a matching circuit to the 215 MHz filter and a wide band strip line LC trap circuit to filter the input RF signals (for each band) for optimum mixer performance. In particular, the output signals of the combination filters are coupled to an inductor 302 of mixer 234. The inductor is coupled to a capacitor 304 to ground and to a transistor 308 at a base 310. An inductor 312 is also coupled to base 310. Inductor 302 and capacitor 304 along with capacitor 306 and inductor 312 are selected to provide an RF match at the input of the mixer. That is, the values are selected to provide a 50 ohm impedance for each of the received band, such as 900 Mhz and 1800 MHz. Although other values could be employed within the scope of the invention, inductor 302 is preferably approximately 3.3 nanohenries (nH), capacitor 304 is approximately 0.5 picofarads (pF), capacitor 306 is approximatel 2 pf and inductor 312 is approximately 5.6 nH.

The collector 314 of transistor 308 is coupled to a transmission line 318 which is coupled to ground by way of a capacitor 320. The collector is also coupled to a capacitor 322, which is coupled to an inductor 324 to ground and filter 260. Finally, an inductor 326 is coupled between collector 314 and a resistor 332 coupled to inductor 312. Capacitor 322 and inductor 326 are selected to provide impedance matching to the IF filter 260. The values of strip line 318 and capacitor 320 are selected to provide an LC trap circuit to filter the RF input signals for optimum mixer performance. In particular, the values are selected to provide a low impedance at the output to prevent the RF signals from being passed to filter 260, and providing a clean IF signal to filter 260. For a dual-band radiotelephone receiving 900 Mhz and 1800 MHz RF signals, strip line 318 preferably has a width of approximately 20 mils and a length of approximately 350 mils, providing an inductance of approximately 3 nH. Capacitor 320 preferably is a 4.7 pF capacitor, while inductor 326 is approximately 27 nH.

Finally, the mixer is designed to provide an IF match to filter 260. Inductor 326 and capacitor 322 are preferably selected to provide low impedance to the IF frequency of the mixer. For a 215 MHz IF frequency, capacitor 322 is approximately 33 pF while inductor 326 is approximately 27 nH. Similarly, an IF trap is provided to prevent the intermediate frequency from being fed back to transistor 308. In particular, a capacitor 334 coupled between inductor 312 and ground provides a trap for the IF signal. For an IF frequency of 215 MHz, inductor 312 is approximately 5.6 nH and capacitor 334 is approximately 68 pF.

In a tri-band radiotelephone, an additional RF path can be provided for receiving signals from a third communication system. For example, the communication device could also be adapted to receive PCS 1900 signals. In particular, in FIG. 4, line 212 could be coupled to a third RF stage by way of transmission lines 451 and 414 which are coupled to a filter 416. For example, filter 416 could be a three pole bandpass ceramic filter used as a preselector filter. The ceramic filter could be tuned to pass RF signals at 1930–1990 MHz in the PCS 1900 receive band. The filtered signal is then transmitted to a preamplifier 418. Preferably, preamplifier 418 includes an enable line 420 for enabling or disabling the preamplifier. Preferably, the enable line controls a transistor to provide isolation to the mixer from transmitter energy and other spurious frequencies. The output of the preamplifier 418 is coupled to a combination filter 422 at a fifth input 424 and a LO injection frequency at a sixth input 426 by way of transmission lines 430 and 452 coupled to a voltage controlled oscillator 228. The combination output 432 of filter 422 is coupled to mixer 234 by way of transmission lines 436 and 453. Although three stages are shown in the present invention, additional stages could be employed as necessary depending upon the number of networks being accessed.

Figure 4:
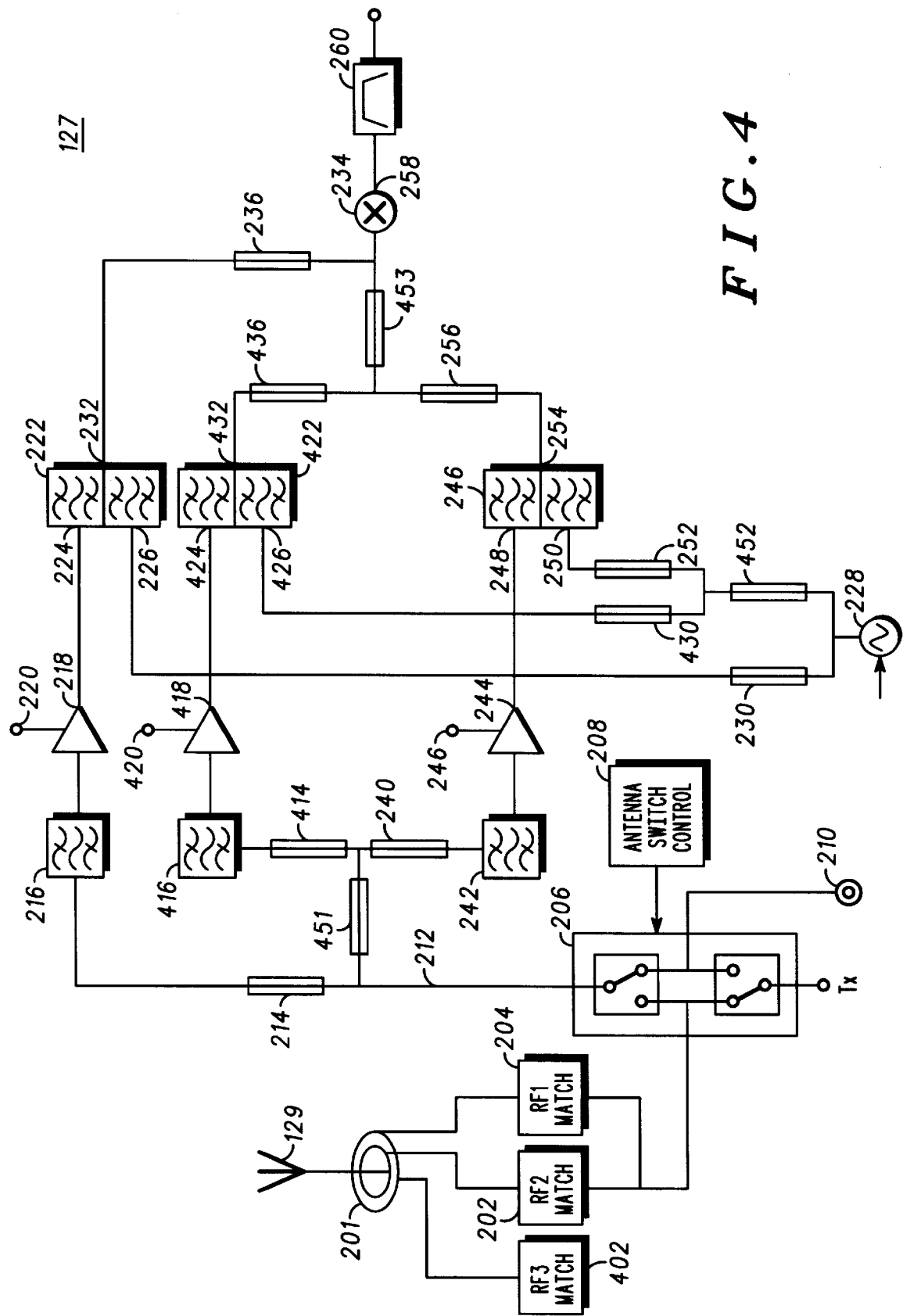
FIG. 4 is a block diagram of receiver 127 of FIG. 1 according to an alternate embodiment of the present invention.
Figure 5:
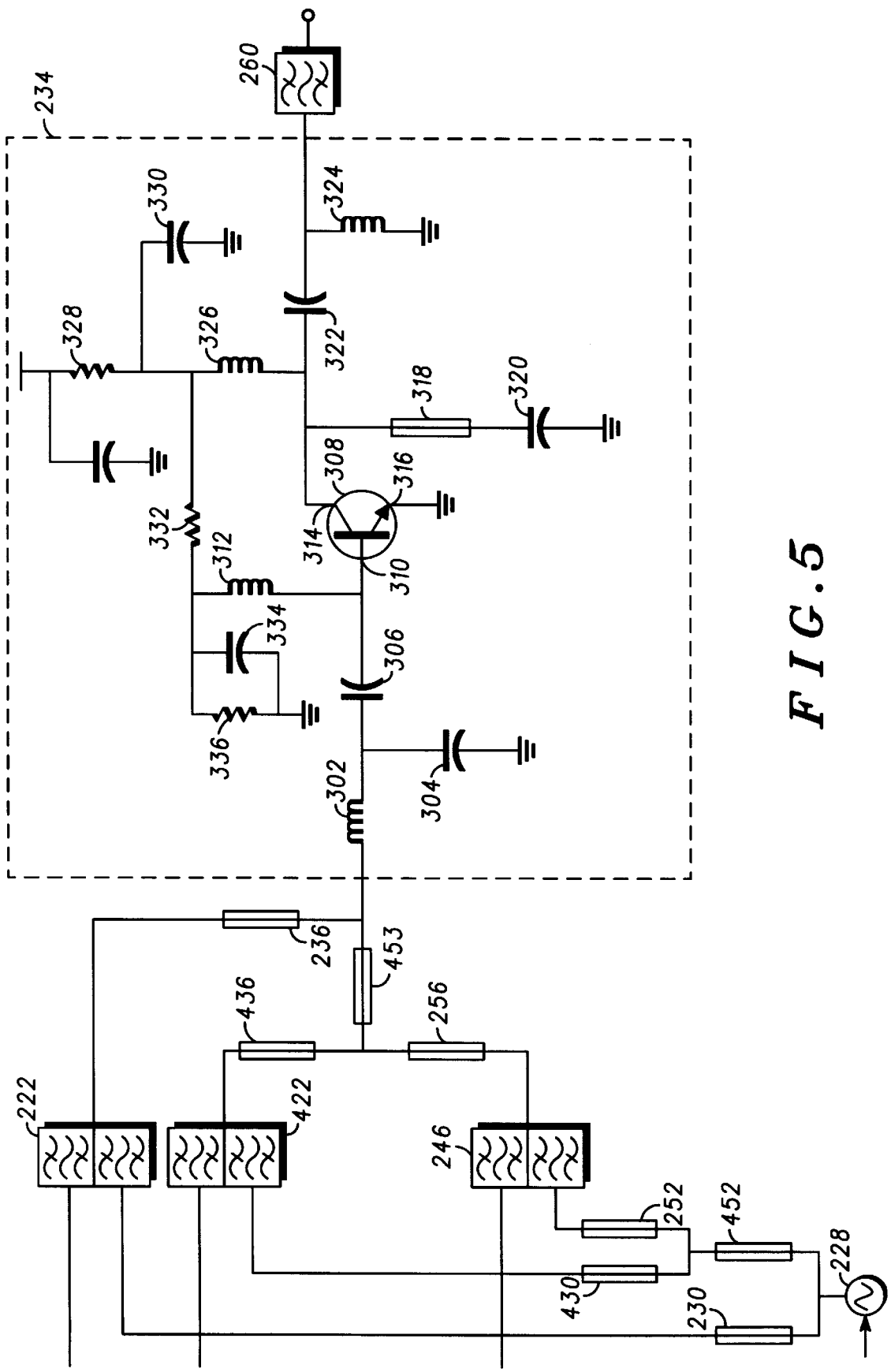
FIG. 5 is schematic diagram of mixer 234 according to an alternate embodiment of the present invention.

Turning to FIG. 5, a circuit diagram shows mixer 234 of FIG. 4. The mixer is designed to operate at GSM 900 Mhz, DCS 1800 MHZ and PCS 1800 Mhz frequency bands in a tri-band radiotelephone. The mixer input is designed to match at 50 ohms in all three frequency bands, and to filter the output 215 Mhz IF signal. Similarly, the mixer output circuit is designed with a matching circuit to the 215 Mhz filter in a wide band strip line LC trap circuit to filter the input RF signals (for all three bands) for optimum mixer performance. The remaining portions of the FIGS. 4 and 5 are identical to FIGS. 2 and 3, and the functionality of those sections will not be repeated again here.

Although the invention has been described and illustrated in the above description and drawings, it is understood that this description is given by way of example only and that numerous changes and modifications can be made by those skilled in the art without departing from the true spirit and scope of the invention. For example, specific radiotelephone systems having specific receive bands are described. However, other systems, such as EGSM, are contempled by the present invention. Although the present invention finds particular application in portable cellular radiotelephones, the invention could be applied to any portable device, including pagers, electronic organizers, or computers. Our invention should be limited only by the following claims.

We claim:

1. A communication device for receiving communication signals in a plurality of RF bands, said communication device comprising:

antenna circuitry to receive said communication signals in said plurality of RF bands;

a first path coupled to said antenna circuitry to receive communication signals in a first RF band of said plurality of bands;

a first filter having a first input coupled to said first path to receive said communication signals in said first band and a second input to receive a fixed oscillator frequency, said first filter having a first output for generating a first output signal;

a second path coupled to said antenna circuitry to receive communication signals in a second RF band of said plurality of RF bands;

a second filter having a third input coupled to said second path to receive said communication signals in said second RF band and a fourth input to receive said fixed oscillator frequency, said second filter generating a second output; and a mixer coupled to said first filter and said second filter to combine said first output signal and said second output signal.

2. The communication device of claim 1 wherein said first path comprises a first filter to pass communication signals when said communication signals are in said first RF band.

3. The communication device of claim 2 wherein said first path further comprises a first amplifier coupled to receive a first enable signal for enabling said first path when said communication signals are in said first RF band.

4. The communication device of claim 1 wherein said second path comprises a second filter to pass communication signals when said communication signals are in said second RF band.

5. The communication device of claim 4 wherein said first path further comprises a second amplifier coupled to receive a second enable signal for enabling said second path when said communication signals are in said second RF band.

6. The communication device of claim 1 further comprises a third path wherein said third path comprises a third filter to pass communication signals when said communication signals are in said third RF band.

7. The communication device of claim 6 wherein said third path further comprises a third amplifier coupled to receive a third enable signal for enabling said third path when said communication signals are in said third RF band.

8. A communication device for receiving communication signals in a plurality of RF bands, said communication device comprising:

antenna circuitry to receive said communication signals in said plurality of RF bands;

a first path coupled to said antenna circuitry comprising a first amplifier to receive communication signals in a first RF band of said plurality of bands, said first amplifier coupled to receive a first enable signal for enabling said first path when said communication signals are in said first RF band;

a first filter having a first input coupled to said first path to receive said communication signals in said first band and a second input to receive a fixed oscillator frequency, said first filter having a first output for generating a first output signal;

a second path coupled to said antenna circuitry comprising a second amplifier to receive communication signals in a second RF band of said plurality of RF bands, said second amplifier coupled to receive a second enable signal for enabling said second path when said communication signals are in said second RF band;

a second filter having a third input coupled to said second path to receive said communication signals in said second RF band and a fourth input to receive said fixed oscillator frequency, said second filter generating a second output; and a mixer coupled to said first filter and said second filter to combine said first output signal and said second output signal.

9. A method for receiving communication signals from a plurality of bands, said method comprising the steps of:

coupling communication signals in a first band to a first input of a first filter;

coupling a fixed oscillator frequency to a second input of said first filter;

generating a first output of said first filter;

coupling communication signals in a second band to a first input of a second filter;

coupling said fixed oscillator frequency to a second input of said second filter;

generate a second output of said second filter; and mixing said first output and said second output.

* * * * *